Figure 3:
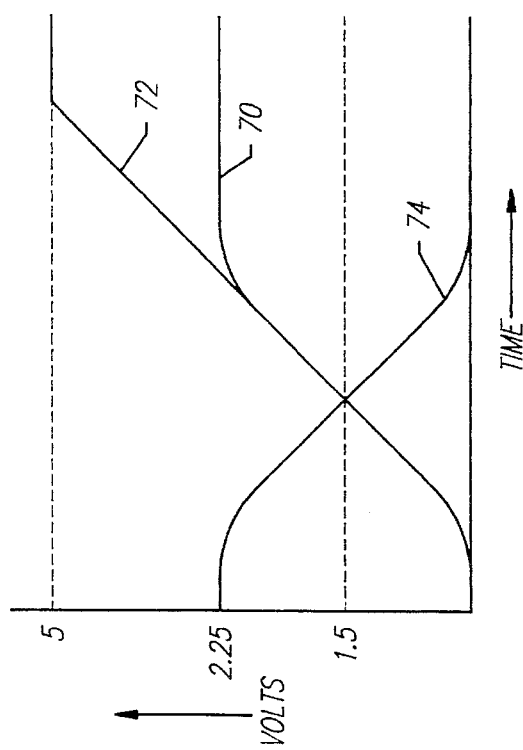

US005486778A

United States Patent [19]
Lou

[11] Patent Number: 5,486,778
[45] Date of Patent: Jan. 23, 1996

[54] INPUT BUFFER FOR TRANSLATING TTL LEVELS TO CMOS LEVELS

[75] Inventor: Perry W. Lou, Carlsbad, Calif.

[73] Assignee: Brooktree Corporation, San Diego, Calif.

[21] Appl. No.: 28,999

[22] Filed: Mar. 10, 1993

[51] Int. Cl.[6] .................. H03K 19/0185; H03K 19/0948
[52] U.S. Cl. ................... 326/71; 326/83; 327/316
[58] Field of Search .................................. 307/475, 451, 307/443, 548, 554; 326/68, 70–71, 83, 86, 121, 21; 327/312, 316

[56] References Cited

U.S. PATENT DOCUMENTS

| | | | |
|---|---|---|---|
| 4,740,713 | 4/1988 | Sakurai et al. | 307/443 |
| 4,843,264 | 6/1989 | Galbraith | 307/443 |
| 5,027,008 | 6/1991 | Runaldue | 307/548 |
| 5,111,080 | 5/1992 | Mizukami et al. | 307/475 |
| 5,113,097 | 5/1992 | Lee | 307/475 |
| 5,204,557 | 4/1993 | Nguyen | 307/443 |

Primary Examiner—Edward P. Westin
Assistant Examiner—Jon Santamauro
Attorney, Agent, or Firm—Ellsworth R. Roston; Charles H. Schwartz

[57] ABSTRACT

An inverter receives an energizing voltage with a particular magnitude (e.g. 1.5 V) at a first terminal and produces the voltage at a second terminal. The received and produced voltages are differentially introduced to a stage which produces a single-ended bias voltage (e.g. 3 V) related to the second terminal voltage. The bias voltage is servoed to regulate the second terminal voltage (e.g. 1.5 V) and the bias voltage (e.g. 3 V) regardless of energizing voltage variations. In response to the bias voltage and a variable input voltage, a pass transistor in a buffer produces a first control voltage different from the bias voltage by the pass transistor threshold voltage for input voltages greater than a value equal to the bias voltage less the pass transistor threshold, and corresponding to the input voltage for input voltages less than the bias voltage less the pass transistor threshold. The first control voltage is inverted to produce a second control voltage having the amplitude of the first control voltage for small amplitude values of the first control voltage, and having transition times and amplitudes of the first control voltage for large amplitude values of the first control voltage. A circuit differentially responds to the control voltage to produce an output voltage which rises and falls in accordance with the variations in the input voltage. The output voltage is servoed to limit the rises and falls.

22 Claims, 2 Drawing Sheets

INPUT BUFFER FOR TRANSLATING TTL LEVELS TO CMOS LEVELS

This invention relates to buffers which produce output voltages in response to input voltages. More particularly the invention relates to buffers in which the output voltages have substantially the same shape and for rising and falling values and substantially the same delay relative to the input voltage for the rising and falling values. The buffer responds to the input voltage to produce the symmetrically rising and falling values without any clock signals.

A standard CMOS inverter has a p-transistor and an n-transistor in series. The widths of the transistors are ratioed to provide a switching voltage at or near 1.4 volts. This is the median voltage of a TTL signal. Such an inverter presents two (2) problems. One problem is that the unusual relative widths of the transistors causes the rising characteristics of the output voltage from the inverter to be significantly longer than the falling characteristics of the output voltage. Furthermore, since the switching threshold in the inverter significantly tracks the energizing voltage VDD introduced to the inverter, the output voltage would be approximately 0.9 volts when the VDD voltage changes from approximately 5 volts to approximately 3.2 volts. This is a relatively small margin for producing states of conductivities in CMOS transistors when the input voltage to the inverter is 0.8 volts and the transistors in the inverter have threshold voltages of approximately 0.7 volts.

In another inverter for converting a TTL voltage of approximately 1.5 volts to a suitable CMOS voltage of approximately 2.5 volts, a servo maintained a specified voltage drop in a series resistor. This servo had the disadvantage of presenting significant input current requirements on the external driving source. Other types of inverters provided differential inputs and a single ended output. These inverters generally employed a differential input stage, a stage for shifting the voltage levels, and stages for increasing the gain. These inverters have considerable complexity and power dissipation. They can be prone to a saturation condition when the inputs are considerably overdriven (e.g. 5 volt signals) and also tend to have progation delays symmetry.

As will be seen, significant attempts have been made to a convert a TTL voltage such as approximately 1.4 volts to a CMOS voltage of approximately 2.5 volts. In making these attempts, individuals have attempted to provide the circuitry with substantially the same rising and falling characteristics in response to input voltages with rising and falling characteristics and the same delay in response to the variable input voltages with rising and falling characteristics. Such individuals have also attempted to make the circuitry simple and to have the circuitry consume relatively low amounts of power. Such attempts have not been successful until now. This invention provides circuitry with the characteristics specified in this paragraph.

In one embodiment of the invention, an inverter receives an energizing voltage with a particular magnitude (e.g. 1.5 V) at a first terminal and produces the voltage at a second terminal. The received and produced voltages are differentially introduced to a stage which produces a single-ended bias voltage (e.g. 3 V) related to the voltage at the second terminal. The bias voltage is negatively introduced back to the inverter to regulate the voltage (e.g. 1.5 V) at the second terminal and the bias voltage (e.g. 3 V) regardless of energizing voltage variations.

In response to the bias voltage and a variable input voltage, a pass transistor in a buffer produces a first control voltage different from the bias voltage by the threshold voltage of the pass transistor for input voltages greater than a value equal to the bias voltage less the pass transistor threshold, and corresponding to the input voltage for input voltages less than the bias voltage less the pass transistor threshold. The first control voltage is inverted to produce a second control voltage. The second control voltage has the amplitude of the first control voltage for a small amplitude in the first control voltage and has the amplitudes and transition times of the first control voltage for large amplitudes in the first control voltage.

A circuit differentially responds to the control voltages to produce an output voltage which rises and falls in accordance with the variations in the input voltage. The output voltage is servoed to limit the rises and falls. The output voltage has substantially the same wave shape for rising and falling values and substantially the same delay relative to the input voltage for the rising and falling values.

Figure 1:
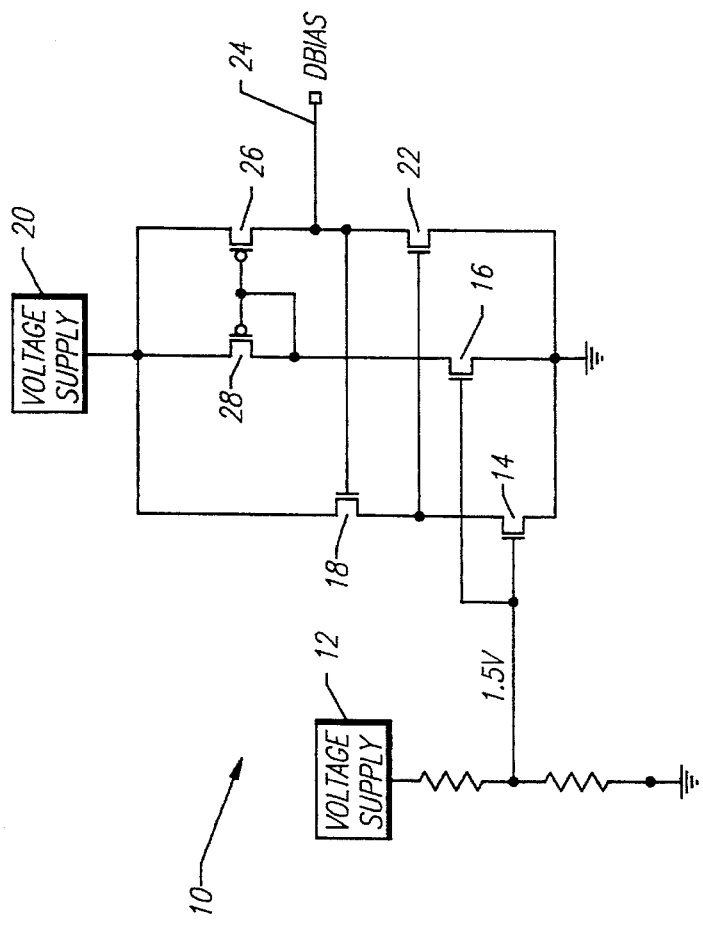
Figure 2:
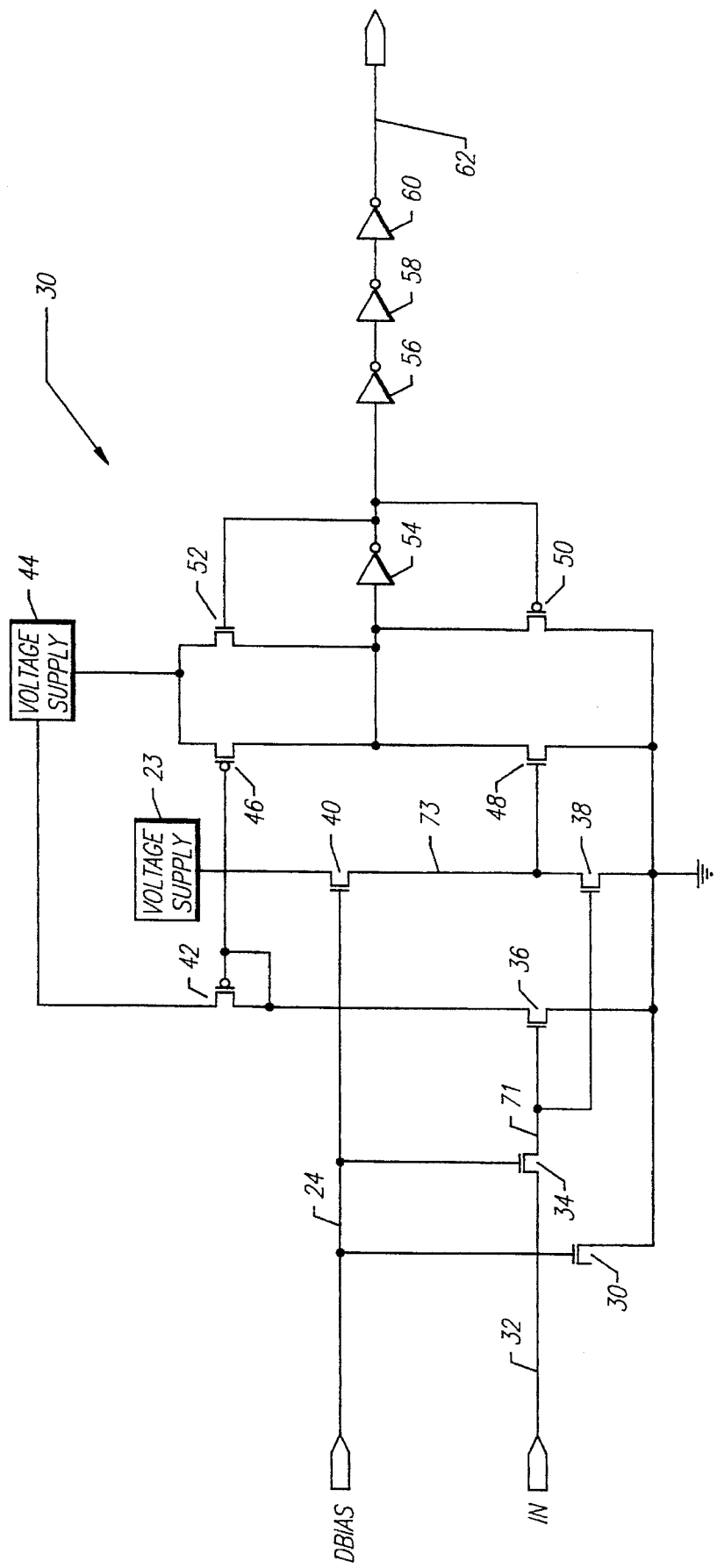

In the drawings:

FIG. 1 is a diagram of a circuit for producing a bias voltage which regulates the switching voltage of a like inverter substantially constant even with significant changes in the value of an energizing voltage;

FIG. 2 is a circuit diagram of a buffer which receives the bias voltage and a variable input voltage and which produces an output voltage which rises and falls in accordance with the variations in the input voltage and in which the rises and falls have substantially the same delays and the same waveforms, and FIG. 3 is a diagram schematically illustrating the variations with time of an input voltage and a pair of control voltages produced at a pair of strategic terminals in the buffer shown in FIG. 2.

In one embodiment of the invention, a bias generator generally indicated at 10 is shown. The bias generator 10 includes a voltage supply 12 for generating a suitable TTL reference voltage such as approximately one and one half volts (1.5 V.). Any suitable voltage supply 12 may be used. The TTL reference voltage generated from the supply 12 may be introduced to the gates of transistors 14 and 16 both of which may be CMOS transistors of the n-type. The source of the transistor 14 is at a reference potential such as ground.

The drain of the transistor 14 may be common with the source of a transistor 18 which may be a CMOS transistor of the n-type. The drain of the transistor 18 may receive an energizing voltage from a voltage supply 20 which receives a voltage preferably of five volts (5 V.). However, this voltage may vary as high as approximately eight volts (8 V.).

A connection is made from the drain of the transistor 14 to the gate of a transistor 22 which may be a CMOS transistor of the n-type. The width (e.g. 10 μ) of the gate of the transistor 22 may be substantially the same as the width (e.g. 10 μ) of the gate in the transistor 16. The source of the transistor 22 may be at the reference potential such as ground as may the source of the transistor 16. An output line 24 and the drain of a transistor 26 have a common connection with the drain of the transistor 22. The bias voltage on the line 24 is designated as "DBIAS" in FIGS. 1 and 2. The transistor 26 may be a CMOS transistor of the p-type and may have a width (e.g. 30 μ) considerably greater than the widths of the gates in the transistors 16 and 22.

The source of the transistor 26 receives the energizing voltage from the voltage supply 20 as does the source of a transistor 28. The transistor 28 may be a CMOS transistor of the p-type with a gate width (e.g. 30 μ) substantially equal to the gate width of the transistor 26. The gates of the transistors 26 and 28 and the drain of the transistor 28 have a common connection with the drain of the transistor 16.

When the TTL reference voltage of approximately one and one half volts (1.5 V.) is applied to the gate of the transistor 14, a corresponding voltage of approximately one and one half volts (1.5 V.) is produced on the drain of the transistor. This results from the operation of the series branch formed by the transistors 18 and 14 and because of the feedback signal "DBIAS". Because of this, substantially equal voltages are introduced to the gates of the transistors 16 and 22.

The transistors 16, 22, 26 and 28 receive a differential input at the gates of the transistors 16 and 22 and provide a single-ended output on the line 24. Furthermore, the transistors 16 and 28 respectively have substantially the same characteristics as the transistors 22 and 26. This provides a balanced arrangement in the operation of the circuit branch formed by the transistors 22 and 26 and the transistors 16 and 28.

The voltage of 1.5 volts on the drain of the transistor 14 is introduced to the gate of the transistor 22. The circuit branch formed by the transistors 22 and 26 operates to provide on the drain of the transistor 22 a voltage. This voltage is introduced as a negative feedback back to the gate of the transistor 18 to regulate the voltage on the source of the transistor 18 and the drain of the transistor 14 at substantially 1.5 volts. This regulation is maintained even though the voltage from the voltage supply may vary from approximately five volts (5 V.) to a voltage as high as approximately eight volts (8 V.).

The line 24 is also shown in FIG. 2. Any variations in the bias voltage on the line 24 are smoothed by a capacitor 30 connected between the line and the reference potential such as ground. An input voltage on a line 32 is designated as "IN" in FIG. 2. The voltages on the lines 24 and 32 are respectively introduced to the gate and drain of a pass transistor 34 which be a CMOS transistor of the n-type.

The source of the transistor 34 is common with the gates of transistors 36 and 38 each of which may be a CMOS transistor of the n-type. The sources of the transistors 36 and 38 may be at the reference potential such as ground. The drain of the transistor 38 and the source of a transistor 40 may be common. The transistor 40 may be a CMOS transistor of the n-type and may have a gate width (e.g. 10 μ corresponding to the gate width of the transistor 18. The gate of the transistor 40 receives the bias voltage on the line 24. The source of the transistor 40 receives an energizing voltage such as approximately five volts (5 V.) to eight volts (8 V.) from a voltage supply 23.

The drain of the transistor 36 has a common connection with the drain and gate of a transistor 42. The transistor 42 may be a CMOS transistor of the p-type. An energizing voltage such as approximately three volts (3 V.) is applied from a power supply 44 to the source of the transistor 42. However, the voltage from the power supply 44 may vary as high as approximately five volts (5 V.).

The gate of the transistor 42 is common with the gate of a transistor 46. The transistor 46 may be a CMOS transistor of the p-type and may have a gate width (e.g. 10 μ) corresponding to the gate width of the transistor 42. The source of the transistor 46 receives the energizing voltage from the power supply 44. A connection is made from the drain of the transistor 46 to the drain of a transistor 48 which may be of a CMOS transistor of the n-type. The gate width (e.g. 6 μ) may correspond to the gate width of the transistor 36. The source of the transistor 48 is at the reference potential such as ground.

A series branch is formed by a pair of transistors 50 and 52 between the power supply 44 and the reference potential such as ground. Each of the transistors 50 and 52 may be a CMOS transistor. An amplifier-inverter 54 has its input connected to the drain of the transistor 46, the drain of the transistor 48, the source of the transistor 52 and the source of the transistor 50. The output of the amplifier-inverter 54 is connected to the gates of the transistors 50 and 52. Amplifier-inverters 56, 58 and 60 are in series with the amplifier-inverter 54 to provide increases in gain in the output from the amplifier-inverter 54. An output voltage is obtained on a line 62 connected to the amplifier-inverter 60.

The pass transistor 34 produces on its source a voltage dependent upon the amplitude of the input voltage on the line 32 relative to the magnitude of the bias voltage on the line 24. For input voltages having an amplitude equal to or greater than a value equal to the bias voltage on the line 24, less the threshold voltage of the transistor 34, the source of the transistor 34 receives a voltage substantially equal to the bias voltage less the threshold voltage between the gate and the source of the transistor. Since the bias voltage is approximately 3 volts and the threshold voltage is approximately 0.75 volts, the voltage on the drain of the transistor 34 is approximately 2.25 volts. For input voltages less than 2.25 volts on the line 32, the voltage on the source of the transistor 34 progressively decreases below 2.25 volts as the amplitude of the input voltage progressively decreases. This is illustrated by the curve 70 in FIG. 3 for the voltage on the source of the transistor 34 and by the curve 72 for the input voltage on the line 32. As will be seen, the curve 70 is not linear. Furthermore, the curve 70 substantially coincides with the curve 72 for values below approximately 2.25 volts.

The voltage on the source of the transistor 34 may be considered to constitute a first control voltage. The voltage on the source of the transistor 34 is introduced to the gate of the transistor 38. The transistor 38 and the transistor 40 are connected in a series branch with relative gate widths corresponding to those of the transistors 14 and 18 to produce the voltage of 1.5 volts on the drain of the transistor 38 when the voltage on the gate of the transistor 38 is 1.5 volts. The voltage on the drain of the transistor 38 may be considered to constitute a second control voltage. As the voltage on the source of the transistor 34 decreases below 2.25 volts, the voltage on the drain of the transistor 38 increases from zero volts (0 V.). This is indicated at 74 in FIG. 3. Thus, the voltage on the drain of the transistor 38 is inverse to the voltage on the gate of the transistor 38 with a crossover in voltages when the voltage on the drain of the transistor 38 equals the voltage on the gate of the transistor 34 at the regulated bias value of 1.5 V. This may be seen by comparing the curves 70 and 74 in FIG. 3.

For a high value of the input voltage on the line 32, the first control voltage on a line 71 connected to the source of the transistor 34 initially changes quickly from a low value toward a maximum value of approximately 2.25 volts. As the level of the voltage on the line 71 approaches 2.25 volts, the conductivity of the pass transistor 34 decreases. This results from the fact that the voltage between the gate and the source of the transistor 34 decreases with increases in the source voltage, thereby causing the transistor to become increasingly non-conductive. This significantly slows the rise in the voltage on the line 71 as this voltage approaches 2.25 volts.

When the input voltage on the line 32 is low, the voltage on the line 71 changes quickly to the value of the input voltage. This results from the fact that the drain of the transistor 34 effectively acts as a source. The resultant large difference in the voltage on the gate of the transistor 34 and the effective source (actually the drain) of the transistor causes the transistor to become highly conductive, thereby causing the voltage on the effective drain (actually the source) of the transistor to follow the voltage on the effective source (actually the drain) of the transistor.

When the voltage on the line 71 is low, the transistor 38 is not conductive. The transistor 40 accordingly charges to a maximum value at its source dependent upon the bias voltage on the line 24 less the threshold voltage of the transistor. The voltage on the source of the transistor 40 is the same as the voltage on a line 73, this voltage being the second control voltage. As the voltage on the line 73 approaches 2.25 volts, the conductivity of the transistor 40 decreases because the voltage between the source and the gate of the transistor decreases. This significantly slows the rise in the voltage on the line 73.

For a high value (e.g. 2.25 V.) of the first control voltage on the line 71, the transistor 38 is highly conductive. This causes the voltage on the line 73 to fall quickly to a voltage approaching the reference potential such as ground. This voltage approaching ground may not be the same as the low voltage on the line 71. Actually, the low voltage on the line 73 may be higher than the low voltage on the line 71 because of the limited drive voltage available to the gate of the transistor 38 and because of the constant load current from the transistor 40. This mismatch is of no concern. It is important only that the shapes of the falling voltages on the lines 71 and 73 are similar down to the threshold levels of the transistors 36 and 48.

As previously described, a high voltage on the input line 32 causes the transistors 36 and 38 to become conductive. This causes low voltages to be produced at the drains of the transistors. Similarly, a low voltage on the input line 32 causes the transistors 36 and 38 to become non-conductive and high voltages to be produced at the drains of the transistors. Furthermore, the shapes of both the rising and falling voltages at the drain of the transistor 36 are similar to the corresponding voltage changes on the lines 71 and 73.

The similarity between the shapes of the rising and falling voltages on the drain of the transistor 36 and the rising and falling voltages on the lines 71 and 73 may be seen from the following discussion. Since the gate and the drain of the transistor 42 (the load device for the transistor 36) are common, the transistor has the characteristic of a "MOS diode" even though it is of the p-type. This causes the current through the transistor 42 to increase approximately with the square of the voltage between the gate and the source of the transistor. This is the same mode of operation as the transistor 40, the load device for the transistor 38. In other words, the current through the transistor 40 increases approximately with the square of the voltage between the gate and the source of the transistor.

As the load transistors 40 and 42 charge their respective drain voltages, their currents decrease in similar proportions, thereby slowing the voltage rises near their respective voltage output levels. Since both the transistors 36 and 38 receive their inputs from the control voltage on the line 71 and since the branch formed by the transistors 36 and 42 and the branch formed by the transistors 38 and 40 produce voltages with similar shapes, the voltage delay produced in these two (2) branches relative to the voltage on the line 71 are similar.

Each of the transistors 46 and 48 produces at its drain a current dependent upon the input voltage on its gate and dependent upon its transconductance value. The transistors 46 and 48 preferably have respective sizes so that their transductances are substantially matched. If the input voltages to the gates of the transistors 46 and 48 are similar, similar delays to the input voltages to the transistors are produced in the currents through the transistors.

The input voltages to the gates of the transistors 46 and 48 are respectively the output voltages from the branch including the transistors 36 and 42 and the branch including the transistors 38 and 40. These two (2) voltages have been shown above to have similar shapes. In addition, the amplitudes of the voltages introduced to the gates of the transistors 46 and 48 in response to the amplitudes of the voltage on the line 71 will be similar if the gain in the branch defined by the transistors 36 and 42 and the gain in the branch defined by the transistors 38 and 40 are similar.

As will be seen, the total delay from the input voltage on the line 32 to the output current at the terminal common to the drains of the transistors 46 and 48 consists of the common delay through the transistor 34, the similar delays through the branch defined by the transistors 36 and 42 and the branch defined by the transistors 38 and 40, and the similar delays through the transistors 46 and 48. It will be further appreciated that the total delay specified above is matched for rising and falling values of the input voltage on the line 32.

A rising input voltage on the input line 32 produces a delay in the rising characteristic of the voltage on the line 71. The matched inversion characteristics of the branches defined by the transistors 36 and 42 and the transistors 38 and 40 then produce a delayed falling characteristic. Similarly, a falling input voltage on the line 32 produces a delayed falling characteristic on the line 71 and similar matched delayed rising characteristics on the two (2) transistor branches. Thus, each polarity in the changing characteristics of the input voltage on the line 32 provides combined delays which are the same as the combined delays for the other polarity in the changing characteristics of the input voltage.

The branch defined by the transistors 36 and 42 and the branch defined by the transistors 48 and 46 provide a comparator which receives a differential input and which provides a single ended output. The differential input is provided by the voltages on the gates of the transistors 36 and 48, these voltages being respectively indicated at 70 and 74 in FIG. 3. The single ended output is provided on the drain of the transistor 46.

The amplifier-inverter 54 has a triggering voltage of approximately 2.5 volts. At this triggering voltage, the inverted output of the amplifier-inverter 54 is also at approximately 2.5 volts. The voltage on the drain of the transistor 46 is inverted by the amplifier-inverter 54. Thus, as the voltage on the drain of the transistor 46 increases, the voltage at the output of the amplifier-inverter 54 decreases. This decrease in voltage is introduced to the gate of the transistor 52 to produce a decrease in the current through the transistor. When the output of the amplifier-inverter 54 decreases below a threshold above the voltage on the source of transistor 52, the transistor 52 ceases to be conductive. The decrease in the voltage at the output of the amplifier-inverter 54 is also introduced to the gate of the transistor 50. The transistor 50 becomes conductive when the output of the amplifier-inverter 54 decreases below a threshold below the source of transistor 50. As the transistor 50 becomes conductive, the voltage on the drain of the transistor 46 will cease to rise, and the output of the amplifier-inverter 54 will cease to decrease.

The decreases in the voltage at the terminal common to the source of the transistor 50 and the source of the transistor 52 are inverted by the amplifier-inverter 54 to produce an increased voltage at the output of the amplifier-inverter. In this way, the voltage at the output of the amplifier-inverter 54 is regulated so that relatively small decreases in the output from the amplifier-inverter 54 are produced with increases in the input voltage on the line 32.

Similarly, decreases in the input voltage on the line 32 cause the voltage on the source of the transistor 34 to decrease and the voltage on the drain of the transistor 36 to increase. This produces a decrease in the voltage on the drain of the transistor 46. When the voltage on the drain of the transistor 46 decreases, the voltage at the output of the amplifier-inverter 54 increases. This increased voltage increases the current through the transistor 52 and accordingly increases the voltage on the source of the transistor. At the same time, the current through the transistor 50 decreases to produce an increased voltage on the source of the transistor. The increases in the voltage on the source of the transistor 52 and the source of the transistor 50 cause a decreased voltage to be produced at the output of the amplifier-inverter 54. In this way, decreases in the input voltage on the line 32 cause relatively small changes to be produced at the output of the amplifier-inverter 54.

The small changes in the output of the amplifier-inverter 54 have a magnitude of at least two threshold voltages and are centered approximately at the 2.5 V. switching threshold of the amplifier inverter. The amplification and feedback to the transistors 50 and 52 limit the voltage swing at the drains of the transistors 46 and 48 to a smaller value, speeding response time.

The apparatus described above has certain important advantages. It provides a bias generator which produces a bias voltage at a particular value regardless of significant variations in the voltage which energizes the bias generator. This bias voltage controls the voltage which is produced from a pass transistor in a buffer in response to an input voltage introduced to the pass transistor. The buffer produces first and second control voltages which have an inverse relationship to each other but which have equal amplitudes (e.g. 1.5 V.) at a value related to the bias voltage and the threshold characteristics of the pass transistor. The inverse relationship of the first and second control voltages and the crossover values in these voltages at a value of 1.5 V. cause the output voltage from the buffer to have substantially the same characteristics for rising and falling values in the output voltage.

The output voltage is obtained by introducing the first and second control voltages as differential inputs to a comparator which provides a single ended output. The comparator operates to provide substantially the same delay in the output voltage for rising and falling characteristics of the input voltage. The output voltage is servoed to limit the changes in the amplitude of the output voltage in response to changes in the amplitude of the input voltage.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination, first means for providing an input voltage, second means responsive to the input voltage for providing a first control voltage having a first amplitude for amplitudes of the input voltage greater than a first particular amplitude and having an amplitude corresponding to the amplitude of the input voltage for amplitudes of the input voltage less than the first particular amplitude, third means responsive to the first control voltage for providing a second control voltage having a second particular amplitude upon the occurrence of the second particular amplitude in the first control voltage and having an amplitude inverse to the amplitude of the first control voltage for amplitudes of the first control signal different from the second particular amplitude, and fourth means responsive to the first and second control voltages for providing an output voltage related to the input voltage and having the same delay relative to the input voltage for rising and falling amplitude characteristics and having substantially the same rising and falling characteristics with respect to time.

2. In a combination as set forth in claim 1, the second means including a transistor having first, second and third electrodes, the first terminal being connected to receive the input voltage and the third electrode providing the first control voltage, and means connected to the second electrode for providing to the second electrode a bias voltage having an amplitude related to the second particular amplitude.

3. In a combination as set forth in claim 1, the third means including a transistor having first, second and third electrodes, the second electrode receiving the first control signal, the first electrode providing the second control signal, the third electrode receiving a reference potential, and means connected in a circuit with the transistor for providing for the production of the first particular amplitude in the second control signal when the first control voltage has the second particular amplitude.

4. In a combination as set forth in claim 1 wherein the fourth means includes fifth means for limiting the amplitude of the output voltage relative to a third particular amplitude as a median.

5. In a combination as recited in claim 1, fifth means for providing a voltage related to the bias voltage, means for providing an energizing voltage, and means responsive to the energizing voltage and the voltage related to the bias voltage for providing the bias voltage with a particular magnitude regardless of any variations in the energizing voltage.

6. In combination, first means for providing an input voltage, second means for providing a bias voltage at a first particular amplitude, third means responsive to the input voltage and the bias voltage for providing a first voltage having a particular amplitude for amplitudes of the input voltage greater than the particular amplitude and having an amplitude corresponding to the amplitude of the input voltage for amplitudes of the input voltage less than the particular amplitude, fourth means responsive to the first voltage for providing a second voltage having a second particular amplitude upon the occurrence of the second particular amplitude in the first voltage and having an amplitude inversely related to the amplitude of the first voltage for amplitudes of the first voltage different from the second particular amplitude, and fifth means responsive to the first and second voltages for providing an output voltage having an amplitude related to the amplitude of the input voltage.

7. In combination as set forth in claim 6, the third and fourth means being operative to provide the first and second voltages with corresponding wave shapes and to provide the output voltage with substantially the same rising and falling characteristics with respect to time.

8. In a combination as set forth in claim 6, sixth means responsive to the output voltage for limiting the amplitude swings of the output voltage about a particular amplitude as a median.

9. In a combination as set forth in claim 6, sixth means connected in a closed loop and responsive to the output voltage for regulating the output voltage at a median value and with amplitude variations of a limited amplitude about the median value in accordance with the variations in the input voltage.

10. In a combination as recited in claim 6, sixth means for providing a voltage related to the bias voltage, means for providing an energizing voltage, and means responsive to the energizing voltage and the voltage related to the bias voltage for providing the bias voltage with a particular magnitude regardless of any variations in the energizing voltage.

11. In combination, first means for providing an input voltage, second means for providing a bias voltage, third means responsive to the input voltage and the bias voltage for providing a first voltage having a first particular amplitude related to the bias voltage for amplitudes of the input voltage greater than the first voltage and having an amplitude less than the first particular amplitude and related to the input voltage for amplitudes of the input voltage less than the first voltage, fourth means responsive to the first voltage for providing a second voltage having a second particular amplitude upon the occurrence of the first particular amplitude in the first voltage and having an amplitude inverse to the amplitude of the first voltage for amplitudes of the first voltage less than the first particular amplitude, the fourth means being operative to provide the second voltage with substantially the same characteristics of voltage vs. time as the first voltage, and fifth means responsive to the first and second voltages for providing an output voltage having substantially the same delays relative to the input voltage for rising and falling characteristics of the input voltage with respect to time.

12. In a combination as set forth in claim 11, means for providing a reference voltage, the third means including a first transistor having terminals receiving the input and bias voltages and having an additional terminal for providing the first voltage and the fourth means including a second transistor having terminals receiving the first voltage and the reference voltage and having an additional terminal for providing the second voltage.

13. In a combination as set forth in claim 11, sixth means responsive to the output voltage for limiting the range of variation of the output voltage about a third particular amplitude as a median.

14. In a combination as set forth in claim 12, the first and second transistors constituting MOS transistors of the n-type, the fifth means including an n-transistor and a p-transistor and further including means for inverting the output voltage and for introducing the inverted output voltage to the n-transistor and the p-transistor in the fifth means to limit the range of the variations of the output voltage relative to the particular amplitude as a median.

15. In a combination as recited in claim 11, sixth means for providing a voltage related to the bias voltage, means for providing an energizing voltage, and means responsive to the energizing voltage and the voltage related to the bias voltage for providing the bias voltage with a particular magnitude regardless of any variations in the energizing voltage.

16. In combination, first means for providing an input voltage, second means for providing a bias voltage, third means responsive to the input voltage and the bias voltage for providing a first voltage having a first particular amplitude related to the bias voltage for amplitudes of the input voltage greater than the first voltage and having an amplitude less than the first particular amplitude and related to the input voltage for amplitudes of the input voltage less than the first voltage, fourth meads responsive to the first voltage for providing a second voltage having a second particular amplitude upon the occurrence of the first particular amplitude in the first voltage and having an amplitude inverse to the amplitude of the first voltage for amplitudes of the first voltage less than the first particular amplitude, the fourth means being operative to provide the second voltage with substantially the same characteristics of voltage vs. time as the first voltage, and fifth means responsive to the first and second voltages for providing an output voltage having substantially the same delays relative to the input voltage for rising and falling characteristics of the input voltage with respect to time, means for providing a reference voltage, the third means including a first transistor having terminals receiving the input and bias voltages and having an additional terminal for providing the first voltage and the fourth means including a second transistor having terminals receiving the first voltage and the reference voltage and having an additional terminal for providing the second voltage, the first and second transistors constituting MOS transistors of the n-type, the fifth means including an n-transistor and a p-transistor and further including means for inverting the output voltage and for introducing the inverted output voltage to the n-transistor and the p-transistor in the fifth means to limit the range of the variations of the output voltage relative to the particular amplitude as a median, sixth means for providing a voltage related to the bias voltage, means for providing an energizing voltage, and means responsive to the energizing voltage and the voltage related to the bias voltage for providing the bias voltage with a particular magnitude regardless of any variations in the energizing voltage.

17. In combination, first means for providing an input voltage, second means for providing an energizing voltage, third means for providing a first bias voltage having a first particular magnitude, fourth means responsive to the energizing voltage and the bias voltage for regulating the amplitude of the bias voltage at a second particular magnitude related to the first particular magnitude regardless of variations in the energizing voltage, fifth means responsive to the input voltage and the bias voltage for providing a first control voltage having a first particular amplitude for input voltages greater than the particular amplitude and having the amplitude of the input voltage for input voltages less than the particular amplitude, sixth means responsive to the first control voltage for providing a second control voltage having the amplitude of the first control voltage upon the occurrence of a second particular amplitude in the first control voltage and having an amplitude inverse to the amplitude of the first control voltage for amplitudes of the first control voltage different from the second particular amplitude, and seventh means responsive to the first and second control voltages for providing an output voltage having an amplitude related to the amplitude of the second control voltage.

18. In a combination as set forth in claim 17, the fifth means and the sixth means having characteristics relative to each other to provide the output voltage with substantially the same rising and falling characteristics with respect to time.

19. In a combination as set forth in claim 17, the seventh means being operative to provide the output voltage with substantially the same time delay for rising amplitude characteristics of the input voltage as for falling amplitude characteristics of the input voltage.

20. In a combination as set forth in claim 17, the output voltage having a second particular amplitude upon the occurrence of the particular amplitude in the first and second control voltages, and eighth means responsive to the output voltage for limiting the variations in the output voltage about the second particular amplitude as a median.

21. In a combination as set forth in claim 20, the fifth means and the sixth means having characteristics relative to each other to provide the output voltage with substantially the same rising and falling characteristics with respect to time, the seventh means being operative to provide the output voltage with substantially the same time delay for rising amplitude characteristics of the input voltage as for falling amplitude characteristics of the input voltage.

22. In combination, first means for providing an input voltage, second means for providing a bias voltage, third means responsive to the input voltage and the bias voltage for providing a first differential voltage, the first differential voltage having first characteristics of voltage in relation to time, fourth means responsive to the first differential voltage for providing, a second differential voltage with an inverse relationship with time relative to the first differential voltage and with an intersection between the first differential voltage and the second differential voltage at a particular voltage value, and fifth means responsive to the first and second differential voltages for providing an output voltage with substantially identical rising and falling characteristics with respect to time, sixth means for providing a voltage related to the bias voltage, means for providing an energizing voltage, and means responsive to the energizing voltage and the voltage related to the bias voltage for providing the bias voltage with a particular magnitude regardless of any variations in the energizing voltage.

* * * * *